(12) United States Patent
Yadid-Pecht et al.

(10) Patent No.: US 7,688,994 B2
(45) Date of Patent: Mar. 30, 2010

(54) DIGITAL WATERMARKING CMOS SENSOR

(75) Inventors: Orly Yadid-Pecht, Calgary (CA);
Graham R. Nelson, Calgary (CA);
Graham A. Jullien, Calgary (CA)

(73) Assignee: UTI Limited Partnership, Calgary, Alberta (CA)

( * ) Notice: Subject to any disclaimer, the term of this patent is extended or adjusted under 35 U.S.C. 154(b) by 973 days.

(21) Appl. No.: 11/419,183

(22) Filed: May 18, 2006

(65) Prior Publication Data

US 2007/0019090 A1   Jan. 25, 2007

Related U.S. Application Data

(60) Provisional application No. 60/594,924, filed on May 19, 2005.

(51) Int. Cl.
*G06K 9/00* (2006.01)
(52) U.S. Cl. ...................................................... 382/100
(58) Field of Classification Search ................. 382/100
See application file for complete search history.

(56) References Cited

U.S. PATENT DOCUMENTS

| | | | |
|---|---|---|---|
| 6,700,991 B1 * | 3/2004 | Wu et al. ..................... | 382/100 |
| 6,725,372 B1 | 4/2004 | Lewis et al. ................. | 713/176 |
| 2005/0073598 A1 | 4/2005 | Fabinski et al. | |
| 2005/0073725 A1 | 4/2005 | Lim | |
| 2005/0169499 A1 | 8/2005 | Rodriguez et al. | |
| 2005/0248668 A1 | 11/2005 | Machida | |
| 2007/0019090 A1 | 1/2007 | Yadid-Pecht et al. ........ | 348/308 |

FOREIGN PATENT DOCUMENTS

| | | |
|---|---|---|
| EP | 0 926 897 | 6/1999 |
| EP | 1 215 910 | 6/2002 |

OTHER PUBLICATIONS

Friedman, G., "The Trustworthy Digital Camera:Restoring Credibility tot he Photographic Image" IEEE Trans. on Cons. Elec 39(10) Nov. 1993—pp. 905-910.
Bartolini, F., et al. "Image Authentication Techniques for Surveillance Applications" Proc. IEEE 89(10) pp. 1403-1418.
Peticolas, F.A.P., et al. "Information Hiding—A Survey", Proc. IEEE 87(7) Jul. 1999, pp. 1062-1078.
Cox, Ingemar J., et al. "Watermarking as Communications with Side Information" Proc. IEEE 87(7) Jul. 1999, pp. 1127-1141.
De Strycker, L., et al. "Implementation of a real-time digital watermarking process for broadcast monitoring on a TriMedia VLIW Processor" IEE Proc.—Vis. Image Signal Process, 147(4), Aug. 2000, pp. 371-376.
Tirkel, A.Z., et al. "A Unique Watermark for Every Image" IEEE Multimedia 8(4), pp. 30-37.

(Continued)

*Primary Examiner*—Tom Y Lu
(74) *Attorney, Agent, or Firm*—Fulbright & Jaworski L.L.P.

(57) ABSTRACT

A complementary metal oxide substrate (CMOS) active pixel sensor (APS) imaging chip includes a combination circuit, an active pixel sensor array and a watermark generating circuit. Also disclosed are methods of using the CMOS APS imager for watermarking images.

15 Claims, 6 Drawing Sheets

Chip Architecture

OTHER PUBLICATIONS

Mathai, Nebu John, "Hardware Implementation Perspectives of Digital Video Watermarking Algorithms" IEEE Trans. Sig. Proc. 51(4), pp. 925-938 Apr. 2003.

Mathai, Nebu John, "VLSI Implementaion of a Real-Time Video Watermarking Embedder and Detector", Proc. Intl. Symposium on Circuits and Systems 2003, pp. II-772 to II-775.

Mohanty, S.P., et al. "VLSI Implementation of Invisible Digital Watermarking Algorithms Towards the Development of a Secure JPEG Encoder", IEEE Workshop on Signal Processing System Aug. 2003 pp. 183-188.

Mohanty, S.P., et al. "VLSI Implementation of Visible Watermarking for a Secure Digital Still Camera Design", Proc. 17th Intl. Conf. VLSI Design (2004).

Garimella, Annajirao, et al. "VSLI Implementation of Online Digital Watermarking Technique With Difference Encoding for 8-bit GrayScale Images", Proc. 16th Intl. Conf. VLSI Design (2003).

Fossum, Eric R., "CMOS Image Sensors: Electronic Camera-On-A Chip", IEEE Trans. Electron Devices vol. 44 No. 10, pp. 1689-1698, Oct. 1997.

Shcherback, Igor, et al. "CMOS APS Crosstalk Characterization Via a Unique Submicron Scanning System", IEEE Trans. Electron Devices, vol. 50, pp. 1994-1997, Sep. 2003.

International Search Report and Written Opinion, issued in Application No. PCT/IB2009/006811, dated Dec. 1, 2009.

Shoshan et al., "Hardware implementation of a DCT watermark for CMOS image sensors," *Electronics, Circuits and Systems*, 15th IEEE International Conference, pp. 368-71, Aug. 31, 2008.

* cited by examiner

Figure 1. a) Original Image b) 2-bit embedding c) 4-bit embedding

Figure 2. Detection statistics for 2- and 4-bit embedding

Figure 3. Chip Architecture

Figure 4. Pixel Schematic

Figure 5. Pixel Layout

Figure 6. Chip layout

DIGITAL WATERMARKING CMOS SENSOR

CROSS REFERENCE TO RELATED APPLICATIONS

The present application claims priority benefit of U.S. Provisional Patent Application No. 60/594,924 filed on May 19, 2005, the contents of which are incorporated herein by reference.

FIELD OF THE INVENTION

The present invention relates to a CMOS sensor with integral digital watermarking capability.

BACKGROUND

The increasing prevalence of capture and storage for images and video by digital means has introduced the problem of verifiable authenticity. Photographic fraud is a matter of growing concern and numerous attempts have been made to solve the issue using digital watermarking of images [1-5].

A majority of watermark research has been devoted to obtaining a solid understanding of the information theory involved and to software implementation. A recent trend has been the increasing development of hardware-based solutions for digital watermarking. While the software approach holds an advantage in terms of flexibility, certain computational restrictions may arise when attempting to operate at video rates or in a portable device. In 2000, DeStrycker et al. used a TriMedia VLIW DSP to implement real-time embedding and detection of video watermarks for broadcast monitoring [6]. In 2001, Tirkel and Hall of Monash University in Australia proposed a SIMM card for digital camera with an on-board EPLD to embed an invisible watermark [7]. Mathai et al., of the University of Toronto, have done a significant amount of work converting the JAWS watermarking algorithm into VLSI form for real-time video stream embedding [8,9]. As part of a secure JPE Gencoder, Mohanty et al. have outlined a 0.35 μm CMOS chip for watermarking of images [10]. In 2004, they produced another chip for visible watermarking, integrated in a Digital Still Camera architecture [11]. Garimella et al. also recently reported a 0.13 μm CMOS VLSI chip for watermarking of 8-bit grayscale images based on difference encoding [12].

There is still a need in the art for a CMOS chip with integral watermarking which may be conveniently detected and which may allow for unique identification of the sensor itself.

SUMMARY OF THE INVENTION

The present invention is directed to the integration of watermarking with the image sensor at the chip level. Reference [13] describes evolving research in the field of CMOS imagers and includes their integration with image processing. There are many potential advantages to integrating the watermarking operation with the image sensor at the chip level. First, sensor level integration simplifies the watermarking process, making it transparent to the rest of the system and resulting in more efficient integration and operation. Second, co-locating the watermarking circuits with the sensor allows for generation of the watermark based on characteristics inherent to variations in the physical sensor, which may allow for unique identification of specific sensors.

One form of watermarking involves the addition of a pseudo-noise stream to an image. The level of noise is preferably kept low enough that the addition does not change the image in a perceptible manner.

Therefore, in one aspect, the invention comprises a design for a CMOS APS imaging device incorporating circuits using a pseudo-number random bit generating algorithm for watermarking the images obtained from the device. Exemplary chip architecture and circuit designs are described herein along with layout details. In one embodiment, the invention comprises a complementary metal oxide substrate (CMOS) active pixel sensor (APS) imaging chip for watermarking images comprising:

a) a watermark generating circuit for generating a digital watermark;
b) an active pixel sensor array, for sensing an image and producing an array output, in communication with means for digitizing an array output and producing a digitized array output; and
c) a combination circuit for combining the digitized array output and the digital watermark to produce a watermarked image.

In another aspect, the invention comprises a method of embedding a digital watermark in an image, wherein the watermark embedding occurs in a complementary metal oxide substrate (CMOS) active pixel sensor (APS) imaging chip, comprising the steps of:

a) generating a digital watermark;
b) creating a digital array output from an active pixel sensor array, by sensing an image, producing an array output, and digitizing the array output, and
c) combining the digital watermark with the digital array output.

BRIEF DESCRIPTION OF THE DRAWINGS

The invention will now be described with reference to the following figures in which.

DETAILED DESCRIPTION OF PREFERRED EMBODIMENTS

The present invention provides for a method and system for creating a watermark in a digital image created by a CMOS sensor. When describing the present invention, all terms not defined herein have their common art-recognized meanings. To the extent that the following description is of a specific embodiment or a particular use of the invention, it is intended to be illustrative only, and not limiting of the claimed invention. The following description is intended to cover all alternatives, modifications and equivalents that are included in the spirit and scope of the invention, as defined in the appended claims.

A digital watermark is created in the present invention by the combination of a pseudo-noise stream to an image at the chip level. The level of noise is kept low enough that the addition does not change the image in a perceptible manner.

Figure 1:
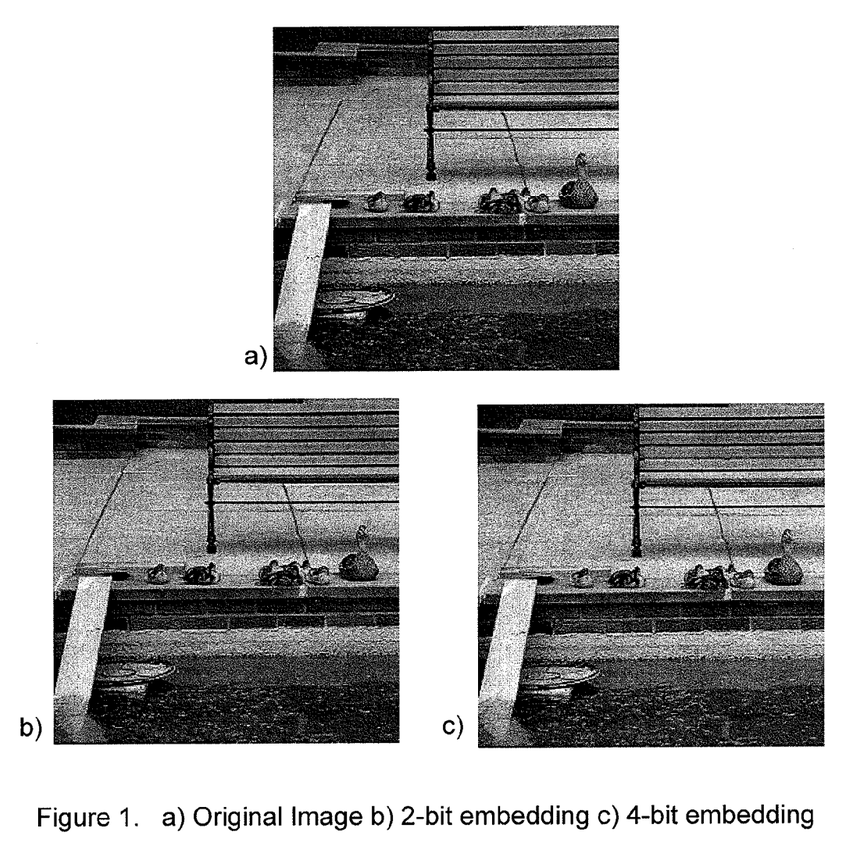
FIGS. 1A, 1B, and 1C are digital photos of an original 256×256 bitmap, the same bitmap with random 2-bit values added to each pixel, and the same bitmap with random 4-bit values added to each pixel respectively.

The minimal effect on image quality can be seen in the examples shown in FIG. 1. FIG. 1A is an original 256×256 bitmap image, while FIG. 1B has random 2-bit values added to each pixel. FIG. 1C is the same image with random 4-bit values added to each pixel. Even with random 4-bit values the image quality is quite good.

Figure 3:
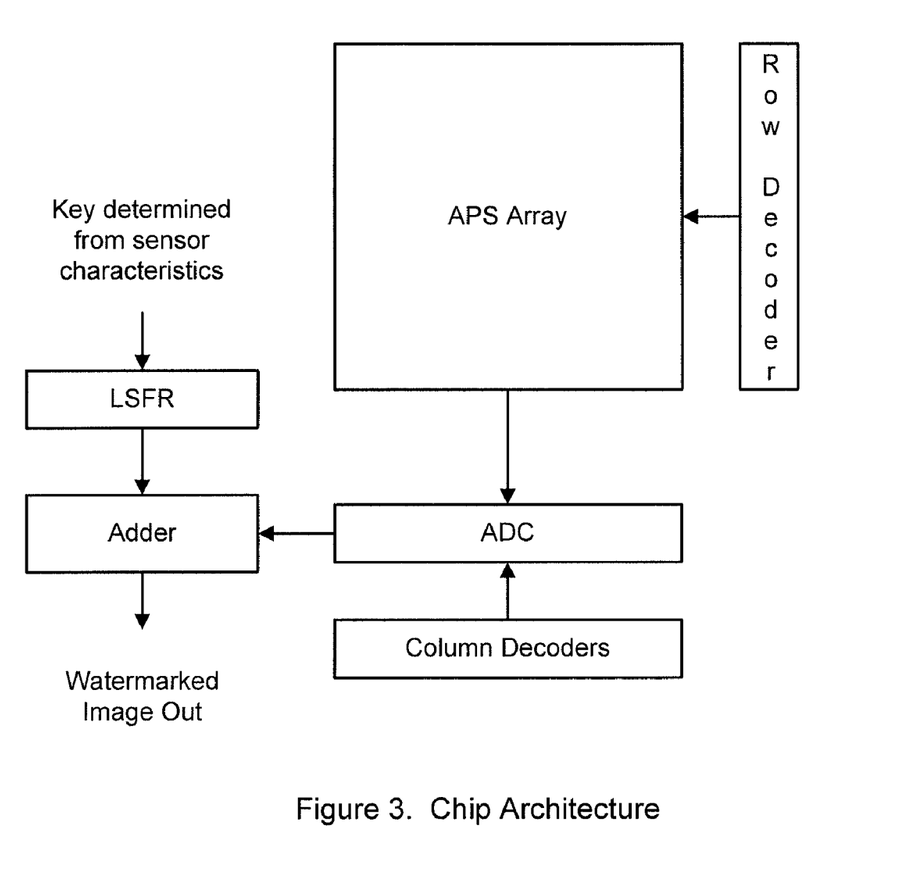
FIG. 3 shows a schematic of one embodiment of the chip architecture.

The architecture of one embodiment of the chip (10) is shown in FIG. 3. The central component is a conventional Active Pixel Sensor (APS) array (12). The output of the array is digitized by column parallel ADCs and passed along to a combination circuit, such as an adder (14). The watermark generation circuit (16) creates a unique bit stream based on an input key. The adder (14) takes the watermark and the output of the ADC and adds them together before passing the watermarked image on to the rest of the system.

The output of the array may be digitized in any ADC such as column parallel ADC, a pixel parallel or, a single ADC for the whole chip. The mode of digitization is not critical, as long as a digital value is produced.

The combination of the digital watermark and the digitized array output may be any logical operation such as addition, subtraction or masking.

Although in the preferred embodiment described herein, the implementation of the watermark is digital, in an alternative embodiment, an analog implementation is possible. For example, a random small voltage may be combined with the APS output before digitization.

Figure 4:
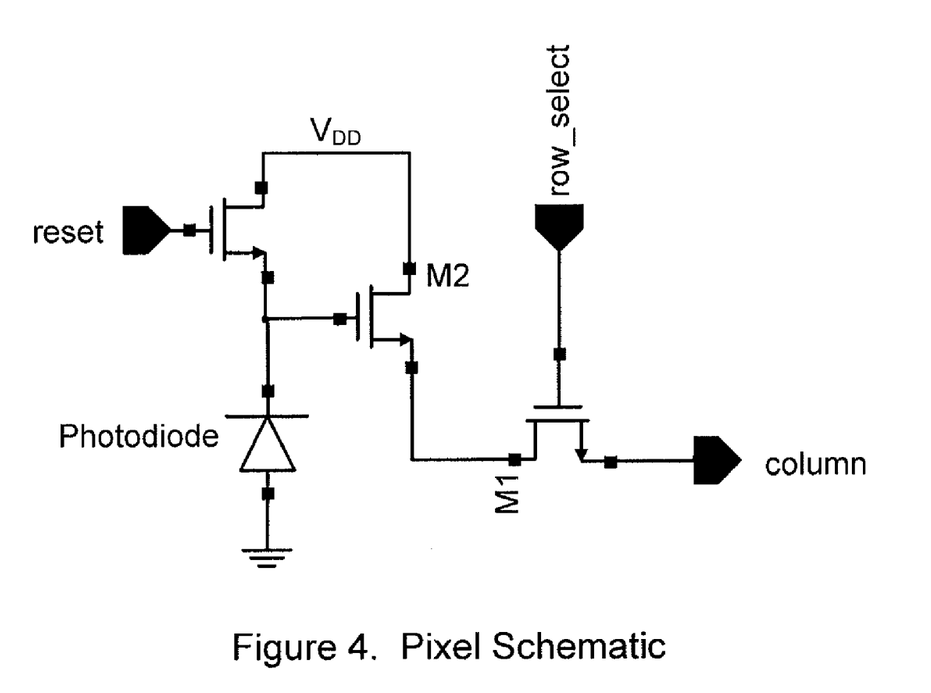
FIG. 4 shows one embodiment of a pixel schematic, which is a typical 3T pixel implementation.

The APS array (12) forms the photosensitive component of the chip. In one embodiment, a traditional three transistor circuit incorporating an n-well photodiode is used, as shown in FIG. 4. The photogeneration of carriers deep in the substrate can lead to pixel crosstalk if the carriers diffuse to a neighbouring pixel [15]. This phenomenon can be minimized via symmetry. In one embodiment, the n-well diode used in a layout as illustrated in FIG. 5 is octagonal and the surrounding transistors are arranged in an 'L' fashion to give the diode approximately the same substrate perspective from each direction.

In one embodiment, 3.3V transistors are preferably used in the pixel in order to allow for greater dynamic range. The pixel pitch may be 5.62 µm×5.62 µm and the fill factor may be 20%. Random access pixel control may be enabled through the use of row and column decoders.

Figure 5:
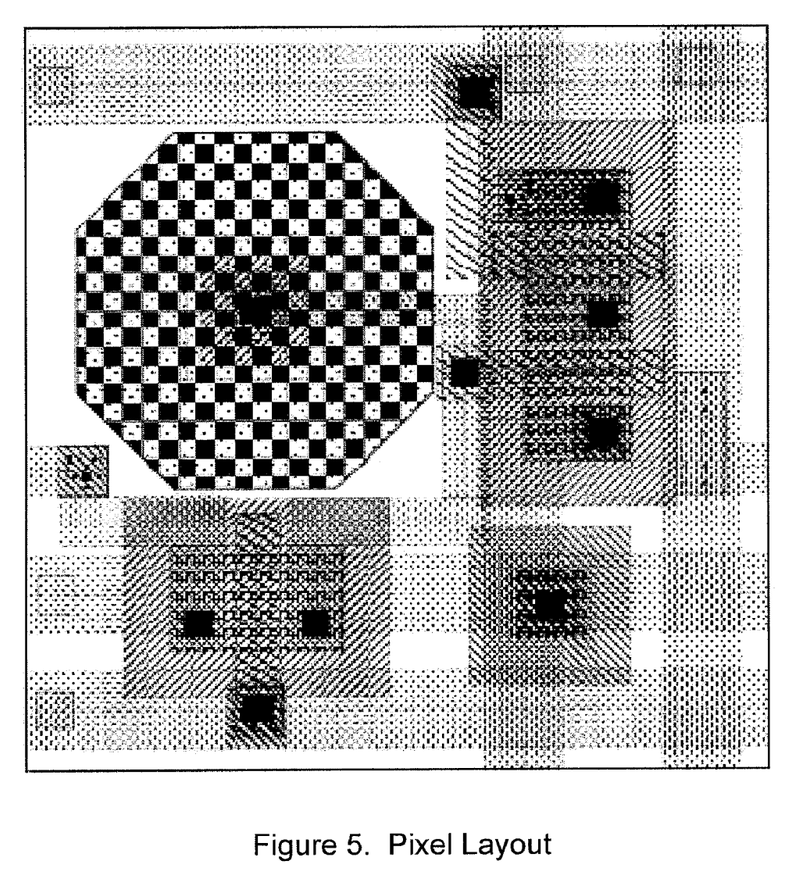
FIG. 5 shows one embodiment of a pixel layout.

The pixel configuration illustrated in FIGS. 4 and 5, and described herein, are illustrative only, and not intended to limit the claimed invention.

As is known in the art, an 8-bit single slope ADC may be provided for each column of pixels in the array [16-18]. A small differential circuit takes the pixel signal from the column bus and compares it to a global ramp signal. A digital count continues throughout the digitization cycle, and when the ramp exceeds the pixel signal, the resulting comparator output triggers a bank of flip-flops to latch the digital value for that column. The value is stored in the flip-flops until the column is selected by the decoding logic and tri-state buffers feed the value onto a global output bus. In preferred embodiment, the digital components operate at 1.8V to minimize power consumption. In one embodiment, the watermark is a stream of pseudorandombits, such as a stream generated by a linear-feedback shift register (LFSR). An LFSR operates by performing an operation such as XOR on the bit values from certain register positions. The result is fed back into the beginning of the shift register. As a result, the values streaming out of the last register position seem random but are completely deterministic on the initial state of the shift register. The value of the initial state is used as a key to reproduce the watermark for detection at a later time. It is important that the key is unique to the sensor and that it remain private otherwise false verification is possible. The length of the initial key may be also be set by the user.

The LFSR or other means provides a stream of bits dependent on the key. The key can be either provided by, or, preferably, dependent on the imager itself. For instance, the key can be a derivation of the FPN (fixed pattern noise) of the imager). Usually the FPN is eliminated, but in this embodiment, some derivation of the raw values can be used as a key. Such a derivation can be, for instance, all the values of all pixels corresponding to a certain illumination (uniform field) value, or a combination of these values, such as an average over blocks, part of blocks, rows or columns, depending on the length of initial key decided upon.

There are multiple ways to obtain an initial key for the LFSR. In one embodiment, bit values from the ADC can be fed into the LFSR, generating an initial state. These values are also the watermark key. Performing an extended dark field exposure on a specific row of the array should generate reasonably reproducible values. A similar procedure with a uniform light-field should allow elements of the fixed pattern noise to be extracted for use as an initial key. Alternatively, either of these operations can be combined with random pixel access to allow the key to be obtained from points spread across the array.

In order to mitigate the potential problem of the watermark obscuring the image, the watermark bits are added only to the lesser bits produced by the ADC. In a preferred embodiment, 2-bits, and more preferably 4-bits, are added to each pixel value of the output image. The bit-stream produced by the LFSR will be grouped into 4-bit vectors and added to the 8-bit ADC output. Preferably, precautions to ensure the addition operation does not overflow the dynamic range should be taken.

EXAMPLES

The following examples are intended to illustrate aspects of the invention and are not intended to limit the claimed invention in any manner.

Figure 6:
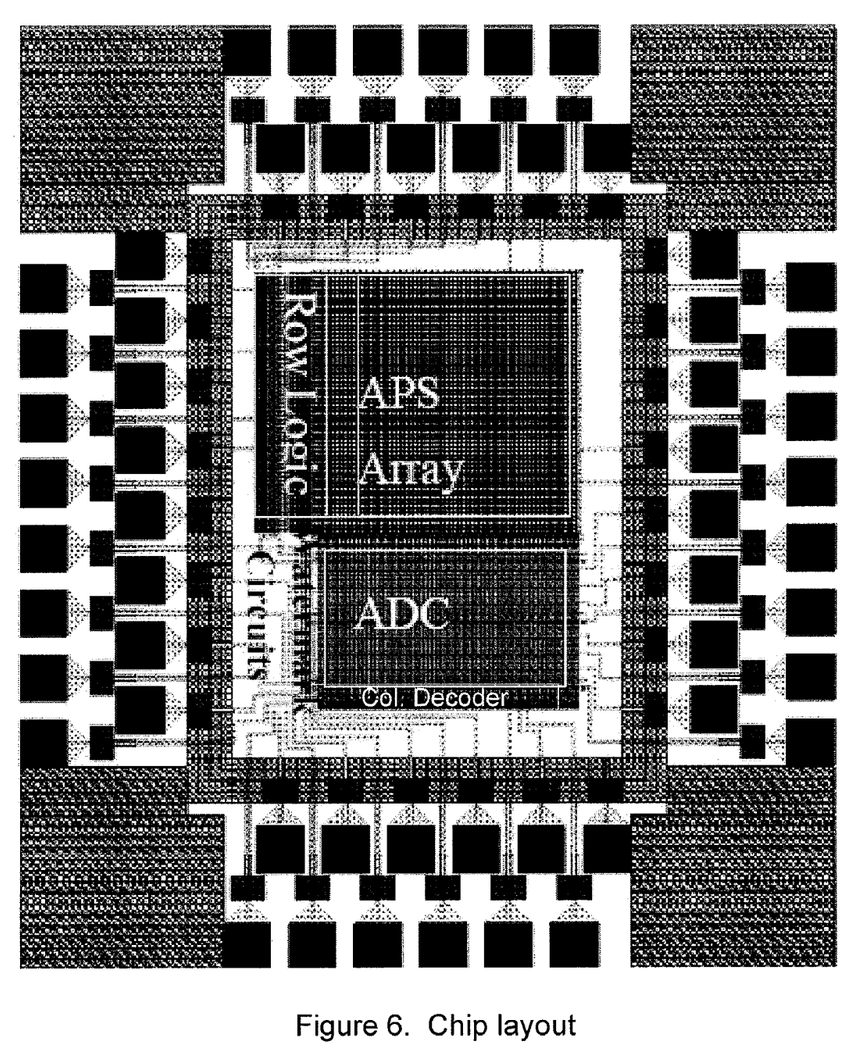
FIG. 6 shows one embodiment of a chip layout.

One embodiment of the imaging chip was developed by incorporating a 64×64 CMOS APS array in a 0.18u CMOS process. The layout was accomplished using the Cadence Design System Environment (Cadence Corporation, San Jose, Calif.) and a final chip design is shown in FIG. 6. Simulations were conducted using Spectre. The device is being fabricated in the TSMC 0.18u1.8V/3.3V process through the Canadian Microelectronics Corporation (Kingston, Ontario, Canada). The final chip size (including pads) is intended to be 1122 µm by 1302 µm.

Figure 2:
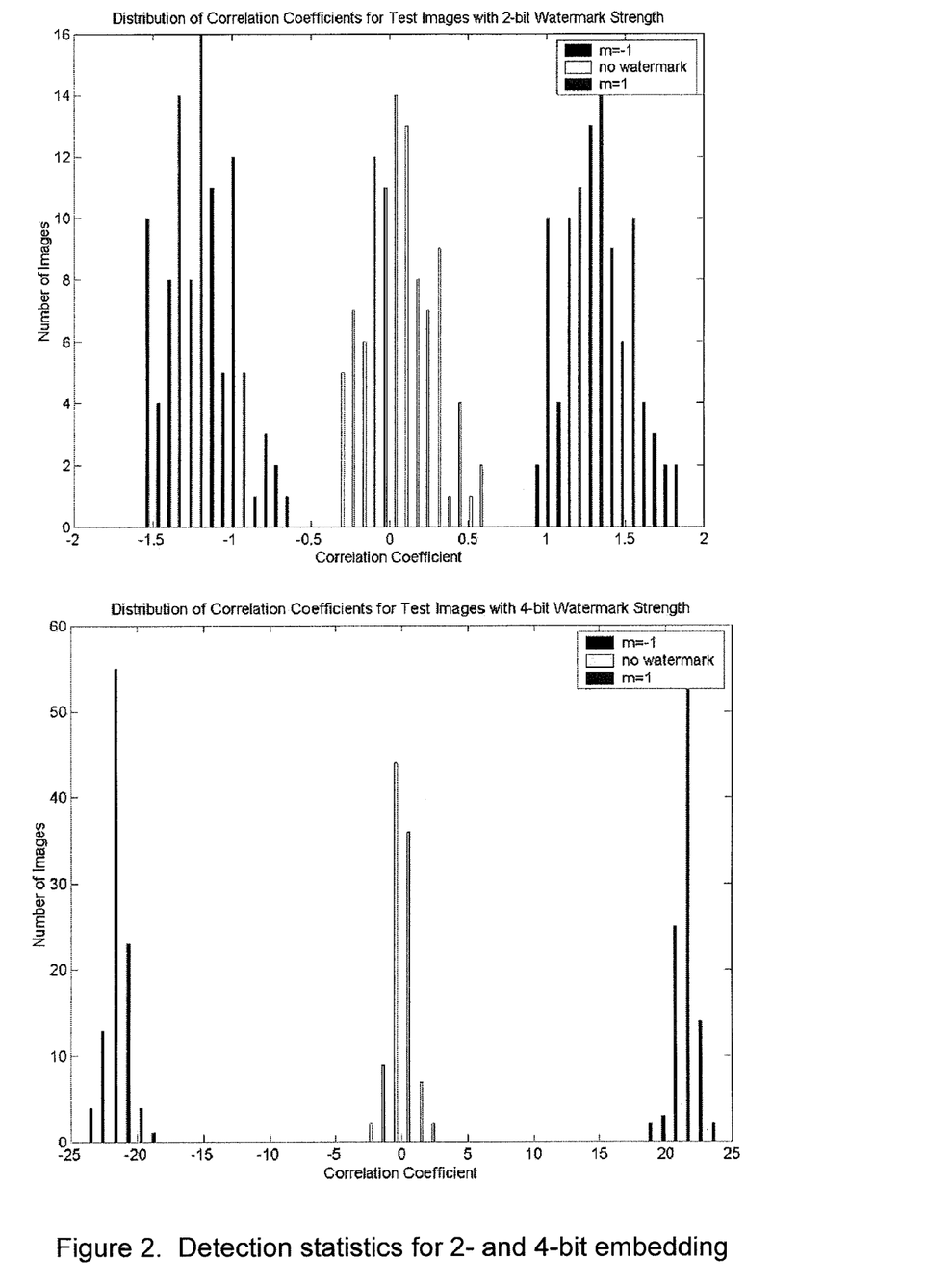
FIG. 2 shows distribution for correlation coefficients for the images shown in FIGS 1B and 1C.

The watermarking algorithm was tested with Matlab (The MathWorks, Natick, Mass.). The results are shown in FIGS. 1 and 2. As mentioned, the 4-bit strength was chosen because it offered greater probability of successful detection while sacrificing a minimal loss in clarity.

Linear correlation with the watermark at a later time gives an indication of the presence or absence of the watermark. FIG. 2 shows the distribution of correlation coefficients for 100 watermarked test images. In both 2-bit and 4-bit cases, there is a clear separation between groups with a watermark and those without. The addition of 4-bit values gives a wider separation and hence easier, more reliable selection of a present/absent threshold on the correlation coefficient.

REFERENCES

The following references are referred to herein as numbers in square brackets and each is incorporated herein as if reproduced in their entirety.

[1] G. Friedman. "The Trustworthy Digital Camera: Restoring Credibility to the Photographic Image" IEEE Trans. on Cons. Elec. 39(10) November 1993 pp. 905-910
[2] F. Bartolini, A. Tefas, M. Barni, and I. Pitas. "Image Authentication Techniques for Surveillance Applications" Proc. IEEE 89(10) pp. 1403-1418
[3] F. A. P. Peticolas, R. J. Anderson, and M. G. Kuhn. "Information Hiding—A Survey" Proc. IEEE 87(7) Jul. 1999 pp. 1062-1078
[4] I. J. Cox I J, M. L. Miller, and A. L. McKellips. "Watermarking as Communications with Side Information" Proc. IEEE 87(7) Jul. 1999pp. 1127-1141
[5] I. J. Cox, M. L. Miller and J. A. Bloom. Digital Watermarking. San Francisco: Morgan Kaufman, 2002.
[6] L. De Strycker, et al. "Implementation of a real-time digital watermarking process for broadcast monitoring on a TriMedia VLIW processor." IEE Proc.—Vis. Image Signal Process. 147(4) August 2000 pp. 371-376
[7] A. Z. Tirkel and T. E. Hall. "A Unique Watermark for Every Image" IEEE Multimedia. 8(4) p. 30-37
[8] N. J. Mathai, D. Kundur, and A. Sheikholeslami. "Hardware Implementation Perspectives of Digital Video Watermarking Algorithms" IEEE Trans. Sig. Proc. 51(4): pp. 925-938 April 2003
[9] N. J. Mathai, D. Kundur, and A. Sheikholeslami. "VLSI Implementation of a Real-Time Video Watermark Embedder and Detector" Proc. Intl. Symposium on Circuits and Systems 2003 pp. II-772 to II-775
[10] S. P. Mohanty, N. Ranganathan, and R. K. Namballa. "VLSI Implementation of Invisible Digital Watermarking Algorithms Towards the Development of a Secure JPEG Encoder" IEEE Workshop on Signal Processing Systems August 2003 pp. 183-188
[11] S. P. Mohanty, N. Ranganathan, and R. K. Namballa. "VLSI Implementation of Visible Watermarking for a Secure Digital Still Camera Design" Proc. 17th Intl. Conf. VLSI Design (2004)
[12] A. Garimella et al. "VLSI Implementation of Online Digital Watermarking Technique with Difference Encoding for 8-bit GrayScale Images" Proc. 16th Intl. Conf. VLSI Design (2003)
[13] O. Yadid-Pecht and R. Etienne-Cummings, eds. CMOS Imagers: from transduction to image processing. Kluwer, 2004.
[14] E. R. Fossum. "CMOS Image Sensors: Electronic Camera-On-A Chip" IEEE Trans. Electron Devices Vol. 44, No. 10, pp. 1689-1698, October 1997
[15] I. Shcherback and O. Yadid-Pecht. "CMOS APS Crosstalk Characterization Via a Unique Submicron Scanning System," IEEE Trans. Electron Devices, Vol. 50, pp. 1994-1997, September 2003
[16] C. Jansson, O. Ingelhag, C. Svensson, and R. Forchheimer, "An addressable 256×256 photodiode image sensor array with an 8-bitdigital output," Analog Integrated Circuits and Signal Processing, vol. 4, pp. 37-49, 1993.
[17] A. Dickinson, S. Mendis, D. Inglis, K. Azadet, and E. R. Fossum, "CMOS digital camera with parallel analog-to-digital conversion architecture," presented at 1995 IEEE Workshop on CCD's and Advanced Image Sensors, Dana Point, Calif., Apr. 20-22, 1995.
[18] Z. Zhou et al. "On-focal-plane ADC: recent progress at JPL" Proc. SPIE Vol. 2745, p. 111-122

What is claimed is:

1. A complementary metal oxide substrate (CMOS) active pixel sensor (APS) imaging chip for watermarking images comprising:
   a) a watermark generating circuit for generating a digital watermark;
   b) an active pixel sensor array comprising a plurality of n-well photodiodes having an octagonal layout, for sensing an image and producing an array output, in communication with means for digitizing an array output and producing a digitized array output; and
   c) a combination circuit for combining the digitized array output and the digital watermark to produce a watermarked image.

2. The imaging chip of claim 1 wherein said means for digitizing comprises column parallel analog digital converters (ADCs), pixel parallel ADCs, or a single ADC for the APS array.

3. The imaging chip of claim 2 wherein said means for digitizing comprises column parallel ADCs.

4. The imaging chip of claim 1 wherein said watermark generating circuit is a linear-feedback shift register (LFSR) and said watermark is a stream of pseudorandom bits.

5. The imaging chip of claim 4 wherein said stream of pseudorandom bits comprises a bit-stream grouped into watermark 4-bit vectors, said digitized array output comprises 8 bit vectors and is grouped into greater ADC output bits and lesser ADC output bits, and the addition circuit is adapted to add the watermark 4-bit vectors to the lesser ADC output bits only.

6. A method of embedding a digital watermark in an image, wherein the watermark embedding occurs in a complementary metal oxide substrate (CMOS) active pixel sensor (APS) imaging chip, comprising the steps of:
   a) generating a digital watermark, wherein the digital watermark is a stream of pseudorandom bits generated from the value of an initial state of a linear-feedback shift register (LFSR);
   b) creating a digital array output from an active pixel sensor array, by sensing an image, producing an array output, and digitizing the array output, and
   c) combining the digital watermark with the digital array output;
wherein the generation of the initial state of the LFSR is accomplished by providing bit values from the ADC.

7. The method of claim 6 wherein said stream of pseudorandom bits comprises a bitstream grouped into watermark 4-bit vectors, said digitized array output is grouped into greater analog digital converter (ADC) output bits and lesser analog digital converter (ADC) output bits comprising 8 bit vectors and the watermark 4-bit vectors are added to the lesser ADC output bits only.

8. The method of claim 6 wherein the initial state of the LFSR is representative of characteristics of the APS.

9. A method of embedding a digital watermark in an image, wherein the watermark embedding occurs in a complementary metal oxide substrate (CMOS) active pixel sensor (APS) imaging chip, comprising the steps of:
   a) generating a digital watermark, wherein the digital watermark is a stream of pseudorandom bits generated from the value of an initial state of a linear-feedback shift register (LFSR);

b) creating a digital array output from an active pixel sensor array, by sensing an image, producing an array output, and digitizing the array output; and c) combining the digital watermark with the digital array output; wherein the initial state of the LFSR is representative of characteristics of the APS.

10. The method of claim 9 wherein said stream of pseudorandom bits comprises a bitstream grouped into watermark 4-bit vectors, said digitized array output is grouped into greater analog digital converter (ADC) output bits and lesser analog digital converter (ADC) output bits comprising 8 bit vectors, and the watermark 4-bit vectors are added to the lesser ADC output bits only.

11. A complementary metal oxide substrate (CMOS) active pixel sensor (APS) imaging chip for watermarking images comprising:

a) a watermark generating circuit for generating a digital watermark;

b) an active pixel sensor array for sensing an image and producing an array output in communication with means for digitizing an array output and producing a digitized array output; and c) a combination circuit for combining the digitized array output and the digital watermark to produce a watermarked image;

wherein said watermark generating circuit is a linear-feedback shift register (LFSR), said watermark is a stream of pseudorandom bits, and said LFSR is adapted to produce said stream of pseudorandom bits from an initial state, and further comprising means for providing bit values from the ADC to generate the initial state of the LFSR.

12. The imaging chip of claim 11 wherein said APS array comprises a plurality of n-well photodiodes.

13. The imaging chip of claim 12 wherein said plurality of n-well photodiodes has an octagonal layout.

14. The imaging chip of claim 11 wherein said means for digitizing comprises column parallel analog digital converters (ADCs), pixel parallel ADCs, or a single ADC for the APS array.

15. The imaging chip of claim 14 wherein said means for digitizing comprises column parallel ADCs.

* * * * *